United States Patent
Riccardi

(10) Patent No.: US 8,723,710 B2
(45) Date of Patent: May 13, 2014

(54) SYSTEM AND METHOD FOR CONTROLLING A DIGITAL SENSOR

(75) Inventor: Sébastien Riccardi, Brezins (FR)

(73) Assignee: Movea, Grenoble (FR)

( * ) Notice: Subject to any disclaimer, the term of this patent is extended or adjusted under 35 U.S.C. 154(b) by 0 days.

(21) Appl. No.: 13/504,463

(22) PCT Filed: Oct. 27, 2010

(86) PCT No.: PCT/EP2010/066244
§ 371 (c)(1),
(2), (4) Date: Sep. 4, 2012

(87) PCT Pub. No.: WO2011/051328
PCT Pub. Date: May 5, 2011

(65) Prior Publication Data
US 2013/0002464 A1  Jan. 3, 2013

(30) Foreign Application Priority Data
Oct. 27, 2009 (FR) ...................................... 09 57541

(51) Int. Cl.
*H03M 1/00* (2006.01)

(52) U.S. Cl.
USPC .......................................... 341/138; 327/512

(58) Field of Classification Search
USPC .......... 341/138; 327/512, 513, 564, 565, 539; 348/208, 223, 362
See application file for complete search history.

(56) References Cited

U.S. PATENT DOCUMENTS

| | | | |
|---|---|---|---|
| 6,930,710 B1 * | 8/2005 | Classen et al. | 348/223.1 |
| 7,405,683 B1 | 7/2008 | Perrin et al. | |
| 2008/0291067 A1 | 11/2008 | O'Dowd et al. | |

FOREIGN PATENT DOCUMENTS

JP  60 053325 A  3/1985

OTHER PUBLICATIONS

International Search Report and Written Opinion of the International Searching Authority issued in corresponding International Application No. PCT/EP2010/066244.

* cited by examiner

*Primary Examiner* — Joseph Lauture
(74) *Attorney, Agent, or Firm* — Stroock & Stroock & Lavan LLP

(57) ABSTRACT

A system for controlling a digital sensor (CN) for measuring a physical quantity (GP) includes a transducer (TRD) delivering as output an analog signal representative of the physical quantity (GP), with means (MGD) for implementing gain and/or shift on the analog output signal (SA1) of the transducer (TRD), and with an analog-digital converter (CAN) at the output of the sensor (CN) so as to deliver a digital signal (SN1). A first means (MA1) applies a first shift to the analog signal of the physical quantity (GP), and a second means (MA2) applies a second shift to the digital signal (SN1). Control means (CMD) continuously controls the first application means (MA1), on the basis of the digital signal (SN1), as well as the second application means (MA2), on the basis of the digital signal (SN1) and/or of the first shift.

11 Claims, 3 Drawing Sheets

US 8,723,710 B2

SYSTEM AND METHOD FOR CONTROLLING A DIGITAL SENSOR

CROSS-REFERENCE TO RELATED APPLICATIONS

This application is the National Stage of International Application No. PCT/EP2010/066244, filed Oct. 27, 2010, which claims foreign priority to French application no. 0957541, filed Oct. 27, 2009. The contents of both of these applications are incorporated herein by reference.

BACKGROUND OF THE INVENTION

The present invention pertains to a system and a method for controlling a digital sensor.

A sensor is a system which transforms an observed first physical quantity into a usable second physical quantity, such as an electric voltage, a height of mercury, an electric current intensity, a needle deviation, etc. The sensor is an interface between a physical process and a manipulatable item of information.

The sensor must be differentiated from the measurement apparatus, which is an autonomous apparatus, having a display or a device for storing data, which is not necessarily the case for the sensor. Sensors are the basic elements of data acquisition systems.

Sensors may be classed in various ways.

For example, they may be distinguished by their energy consumption, as passive sensors or active sensors.

A passive sensor is a sensor which does not require any energy intake from outside in order to operate, for example a thermistor, a potentiometer, or a mercury thermometer. A passive sensor can be modeled by an impedance. A variation in the measured physical phenomenon produces a variation in the impedance. An active sensor is, on the other hand, a sensor which requires energy intake from outside in order to operate, for example a mechanical chronometer, an extensometry gauge, also called a strain gauge, or a gyrometer. An active sensor can be modeled by generators such as photovoltaic and electromagnetic devices. Thus, an active sensor generates either an electric current, or an electric voltage as a function of the intensity of the physical phenomenon measured.

Sensors can also form the subject of a classification by type of output, into analog sensors and digital sensors.

The output signal of an analog sensor is an analog signal, such as an electric voltage or an electric current, while the output signal of a digital sensor is a digital signal, such as a train of pulses, a binary digital code or a fieldbus.

A sensor is generally characterized by several criteria such as the measured physical quantity, the operating range, or the precision. To use a sensor under the best conditions, it is often useful to undertake a calibration and to ascertain the uncertainties in measurements relating thereto.

A digital sensor comprises a transducer delivering as output an analog signal representative of the measured physical quantity. A transducer is a device transforming one physical quantity into another, i.e. an analog signal such as an electric voltage is obtained at the output of the transducer. In a conventional manner, digital sensors also comprise a module for implementing gain and/or shift on the analog output signal of said transducer, as well as an analog-digital converter at the output of the sensor.

The module for implementing gain and/or shift on the analog output signal of the transducer makes it possible to be able to use a digital sensor in an environment, such as a housing, in which an external disturbance modifies the physical quantity to be measured in a relatively constant manner. This may, for example, be the case for a disturbance of a magnetic sensor integrated into a portable telephone comprising loudspeakers furnished with powerful magnets.

In the case of a digital sensor, for example magnetic, illustrated in FIG. 1, the undisturbed nominal operation of which is represented in FIG. 2, when it is integrated into a carrier device consisting of amagnetic components, and the nominal operation of which, when it is integrated into a carrier device in which magnetic sources are embedded, such as a portable telephone, is illustrated in FIG. 3, in which these magnetic sources displace the operating point of the sensor in a significant but known or identifiable manner during the manufacture of the sensor or at diverse times in its duration of use.

In the subsequent description, the examples illustrate cases in which the digital sensor is a magnetometer, but the invention applies to any type of digital sensor.

In FIG. 1, the digital sensor CN, in this instance a digital magnetometer, comprises a transducer TRD delivering as output an analog signal SA1 representative of the measured physical quantity GP. In this instance, the analog signal SA1 at the output of the transducer is an electric voltage. The digital magnetometer CN also comprises a module MGD for implementing gain and/or shift on the analog output signal SA1 of said transducer, so as to transmit an analog signal SA2 to an analog-digital converter CAN at the output of the sensor, so as to deliver a digital signal SN at the output of the digital sensor CN.

FIG. 2 illustrates the undisturbed nominal operation of the digital magnetometer CN of FIG. 1, for example when it is included in an amagnetic housing.

The measured physical quantity GP, in this instance the magnetic field, is the ambient magnetic field, undisturbed by an additional magnetic field. The analog signal GP representing the physical quantity is modified by the transducer TRD into an analog signal SA1, in this instance an electric voltage, to which a gain and/or shift is applied by the module MGD for implementing gain and/or shift, predetermined, depending on the hardware used, so as to obtain an analog signal SA2 included in a range of values acceptable by the analog/digital converter CAN. The range of measurements of the physical quantity GP usable by the transducer TRD, in this instance the magnetic field, comprises values for example between −150 µT and 150 µT, this corresponding as equivalence at the output of the module MGD for implementing gain and/or shift and at the input of the analog/digital converter CAN to an electric voltage SA2 included in a range of values for example from 150 mV to 500 mV. At the output of the analog/digital converter CAN, the corresponding digital signal SN, coded for example on one byte, or stated otherwise on 8 bits of data, can take integer values lying between 0 and 256.

FIG. 3 illustrates the disturbed nominal operation of the digital magnetometer CN of FIG. 1, for example when it is included in a portable telephone comprising loudspeakers creating a predetermined magnetic disturbance.

The measured physical quantity GP, in this instance the magnetic field, is the ambient magnetic field, disturbed by an additional magnetic field due to components of the portable telephone in which the digital sensor CN is embedded. With respect to the case of FIG. 2, the digital sensor being subjected to a constant additional magnetic field due to elements of the portable telephone, such as loudspeakers, the module MGD for implementing gain and/or shift, furthermore applies a constant additional shift to the signal GP, substantially equal to the opposite of the additional magnetic field, so that the analog signal at the input of the digital sensor CN is shifted in such a way as to remain in the range of measurements of the digital sensor CN, i.e. the transducer TRD.

Digital sensors may, however, saturate because of a phenomenon external to that of the measurement, causing, by surprise, the physical quantity to be measured to depart from the measurement range of the sensor.

SUMMARY OF THE INVENTION

One aim of the invention is to alleviate such a problem.

According to one aspect of the invention, there is proposed a system for controlling a digital sensor for measuring a physical quantity, furnished with a transducer delivering as output an analog signal representative of said physical quantity, with means for implementing gain and/or shift on the analog output signal of said transducer, and with an analog-digital converter at the output of the sensor so as to deliver a digital signal. The system furthermore comprises:
  first means for applying a first shift to said analog signal of the physical quantity,
  second means for applying a second shift to said digital signal, and
  control means for continuously controlling said first application means, on the basis of said digital signal, and for continuously controlling said second application means, on the basis of said digital signal and/or of said first shift.

Thus, the present invention makes it possible to avoid saturation of the digital sensor when an unforeseen external disturbance tends to cause the measured physical quantity to depart from the range of values accepted by the digital sensor.

According to one embodiment, said control means are adapted for:
  calculating a difference between the digital signal at the output of said converter and the central value of the range of possible digital values of said digital output signal of said converter;
  continuously controlling said first application means, as a function of said difference; and
  continuously controlling said second application means as a function of said difference.

The system thus allows, in case of abrupt variation of the physical quantity to be measured by the digital sensor, so that it risks departing from the range of values measurable by the digital sensor, the system shifts the signal so that it remains centered as much as possible in said range of values, by centering the digital signal on the range of output values of the digital sensor.

For example, said first shift may be a multiple of an elementary shift depending on the sensitivity of application of the first shift by said first application means.

Thus, the shift instruction is given just once.

As a variant, said first shift may be carried out by a succession of elementary shifts, the elementary shift depending on the sensitivity of application of the first shift by said first application means.

Thus, the elementary shift may be adapted to said sensitivity.

In one embodiment, said control means are adapted for delivering control signals at a frequency substantially equal to the frequency of conversion of the digital sensor.

Thus, the measurement system is at less risk of departing from the digitization window, and the risk of saturation of the sensor is limited since the signal is recentred at each conversion slot.

As a variant, said control means are adapted for delivering control signals at a frequency compatible with the rate of variation of the signal.

Thus, the shift process is adapted so that it consumes less.

According to one embodiment of the invention, said control means comprise a series of instructions executable in a microcontroller.

According to one embodiment, in which said first application means are furthermore adapted for applying a first gain to said analog signal, and said second application means are, furthermore, adapted for applying a second gain to said digital signal.

Thus, in addition to the shift, a gain may also be applied to the input signal of the digital sensor so as to maintain it in the range of values measurable by the digital sensor (de-zoom, gain <1), or to increase the precision of the conversion (zoom, gain >1).

For example, said analog signal at the output of the transducer is an electric voltage.

In one embodiment, said first and second shifts are of opposite signs.

According to another aspect of the invention, there is also proposed a method for controlling a digital sensor for measuring a physical quantity, furnished with a transducer delivering as output an analog signal representative of said physical quantity, means for implementing gain and/or shift on the analog output signal of said transducer, and an analog-digital converter at the output of the sensor so as to deliver a digital signal, characterized in that:
  a first shift is applied to said analog signal of the physical quantity,
  a second shift is applied to said digital signal, and
  said first shift is controlled continuously, on the basis of said digital signal, and said second shift is controlled continuously, on the basis of said digital signal and/or of said first shift.

BRIEF DESCRIPTION OF THE DRAWINGS

The invention will be better understood on studying a few embodiments described by way of wholly non-limiting examples and illustrated by the appended drawings in which.

In the various figures, elements having identical references are identical.

DETAILED DESCRIPTION OF THE INVENTION

Figure 1:
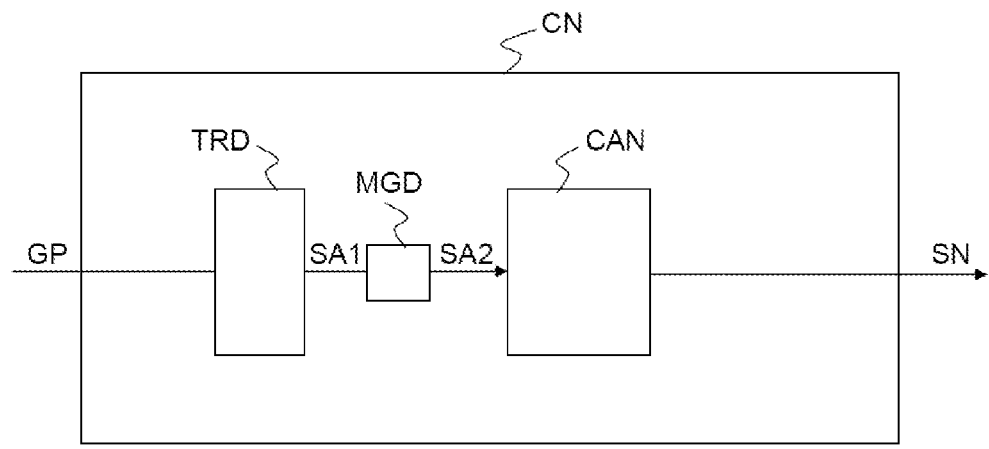
FIG. 1 illustrates a digital magnetic sensor of the state of the art.
Figure 2:
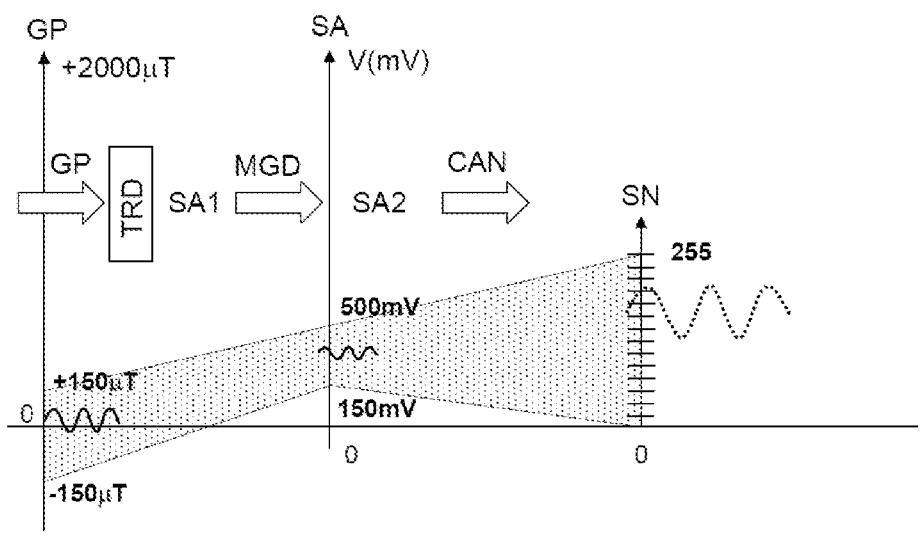
FIG. 2 illustrates the undisturbed nominal operation of the digital magnetometer of FIG. 1.
Figure 3:
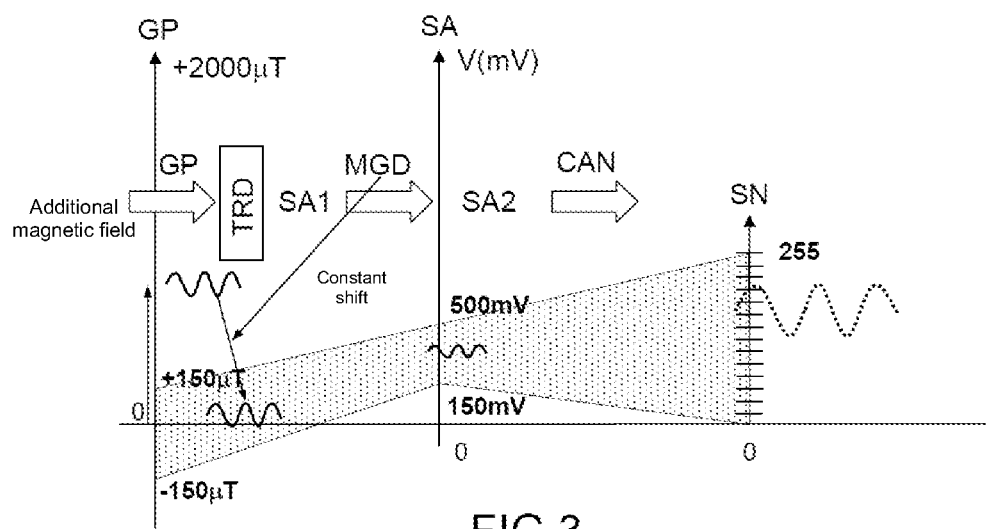
FIG. 3 illustrates the disturbed nominal operation of the digital magnetometer of FIG. 1.
Figure 4:
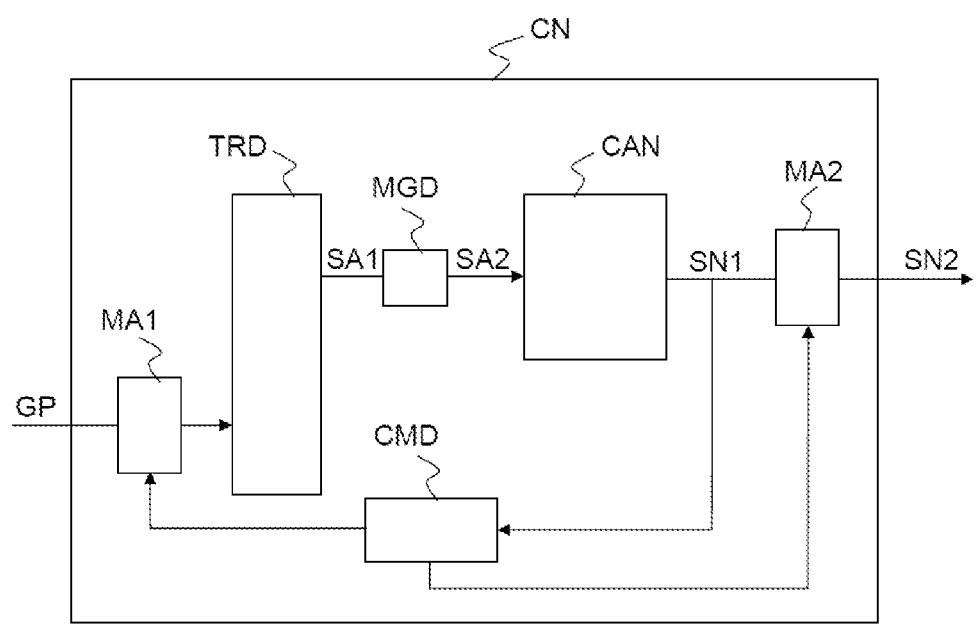
FIG. 4 illustrates a digital magnetic sensor, according to one aspect of the invention.

In FIG. 4, the digital sensor CN, in this instance a digital magnetometer, comprises a transducer TRD delivering as output an analog signal SA1 representative of the measured physical quantity GP. In this instance, the analog signal SA1 at the output of the transducer is an electric voltage. The digital magnetometer CN also comprises a module MGD for implementing gain and/or shift on the analog output signal SA1 of said transducer, so as to transmit an analog signal SA2 to an analog-digital converter CAN at the output of the sensor, so as to deliver a digital signal at the output of the digital sensor CN.

The digital signal SN1 at the output of the analog-digital converter CAN is transmitted to a control module CMD, which, as a function of the digital value of the output signal SN1 of the analog-digital converter CAN, controls continuously, or, stated otherwise, in a dynamic manner, a first module MA1 for applying a first shift to said analog input signal of the sensor CN or physical quantity GP to be measured.

This continuous control makes it possible, in the case of unforeseen disturbance of the physical quantity GP to be measured, in this instance the ambient magnetic field, tending to cause said quantity to depart from the range of values measurable by the sensor CN, and more particularly processable by the transducer TRD, to apply a first shift bringing this analog signal back into this range of values.

Furthermore, after application of such a first shift, the control module CMD controls a second module MA2 for applying a second shift to the digital output signal SN1 of the analog-digital converter CAN, making it possible to have at the output of the digital magnetometer CN, a displayed value taking account of the first shift which was applied at the input so as to avoid saturation.

As a variant, the first application module MA1 is furthermore adapted for applying a first gain to the analog signal at the input of the sensor, and the second application module is, furthermore, adapted for applying a second gain to the digital signal at the output of the sensor CN.

Figure 5:
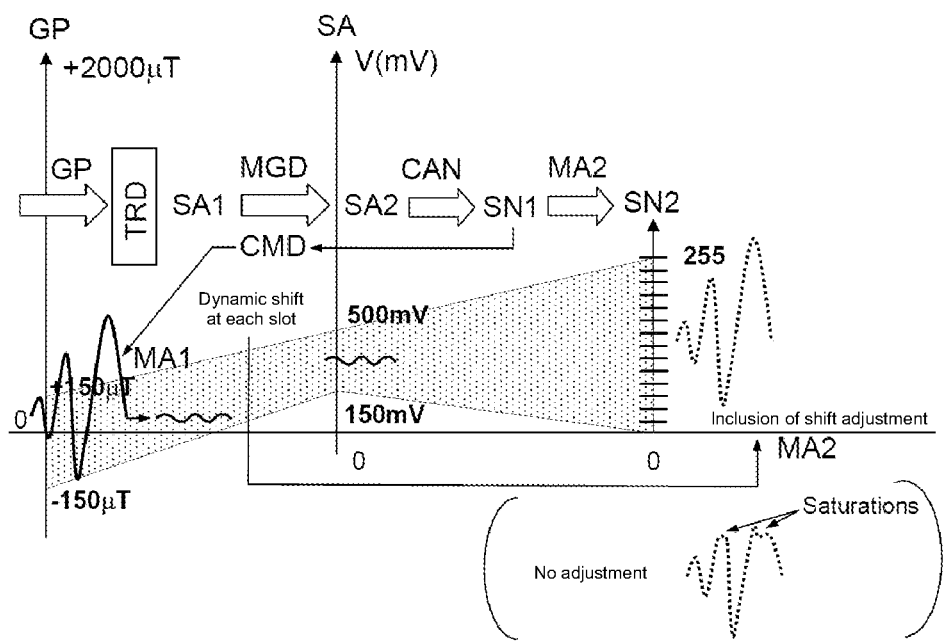
FIG. 5 illustrates the operation of the digital magnetometer of FIG. 4, according to one aspect of the invention.

FIG. 5 illustrates the operation of a sensor of FIG. 4, according to one aspect of the invention.

When a disturbing additional magnetic field suddenly causes the magnetic field to be measured to depart from the possible range of values, in the example the range of values $[-150 \mu T; 150 \mu T]$. When the control module detects that the digital signal SN1 deviates from the central value of the range of digital values coding the output signal, in this instance the value 128, when the digital signal at the output of the analog/digital converter CAN is coded on one byte (8 bits), i.e. on a range of values of from 0 to 255, the control module CMD controls the first shift application module, so that the latter applies a shift making it possible to recenter the analog signal at the input of the magnetometer, by application of a shift, so that it remains in the measurement range of the sensor CN.

The first shift performed by the control module CMD and the first application module MA1, may be done in various ways, for example by a constant elementary shift successively performed, or directly by the necessary shift, possibly being equal to a certain number of times an elementary shift. The elementary shift cited could then depend on the hardware used in the sensor, and on its fineness of application of a minimum shift.

Such a system makes it possible, when a digital sensor is used, to avoid saturation of its measurement, when a disturbance of the physical quantity to be measured by the digital sensor tends to cause the physical quantity to be measured to depart from the range of values measurable by said sensor.

The invention claimed is:

1. A system for controlling a digital sensor for measuring a physical quantity, the digital sensor comprising a transducer for providing an analog output signal representative of the physical quantity, means for implementing gain or shift of the analog output signal of the transducer, and an analog-digital converter to provide a digital output signal of the sensor, the system comprising:
   first means for applying a first shift to the analog output signal;
   second means for applying a second shift to the digital output signal; and
   control means for continuously controlling the first application means, on the basis of the digital output signal, and for continuously controlling the second application means, on the basis of the digital output signal or the first shift.

2. The system as claimed in claim 1, wherein the control means is configured to:
   calculate a difference between the digital output signal at the output of the analog-digital converter and a central value of a range of possible digital values of the digital output signal of the converter;
   continuously controlling the first application means, as a function of the difference; and
   continuously controlling the second application means as a function of the difference.

3. The system as claimed in claim 1, wherein the first shift is a multiple of an elementary shift.

4. The system as claimed in claim 1, wherein the first shift is carried out by a succession of elementary shifts.

5. The system as claimed in claim 1, wherein the control means is configured to deliver control signals at a frequency substantially equal to a frequency of measurement of the digital sensor.

6. The system as claimed in claim 1, wherein the control means is configured to deliver control signals at a frequency compatible with a rate of variation of the signal.

7. The system as claimed in claim 1, wherein the control means comprises a series of instructions executable in a microcontroller.

8. The system as claimed in claim 1, wherein the first application means is further configured to apply a first gain to the analog signal, and the second application means is further configured to apply a second gain to the digital signal.

9. The system as claimed in claim 1, wherein the analog signal at the output of the transducer is an electric voltage.

10. The system as claimed in claim 1, wherein the first and second shifts are of opposite signs.

11. A method for controlling a digital sensor for measuring a physical quantity, the digital sensor comprising a transducer delivering as output an analog signal representative of the physical quantity, means for implementing gain or shift of the analog output signal of the transducer, and an analog-digital converter as an output of the sensor so as to deliver a digital signal, the method comprising:
   applying a first shift to the analog signal of the physical quantity;
   applying a second shift to the digital signal; and
   continuously controlling the first shift on the basis of the digital signal, and continuously controlling the second shift on the basis of the digital signal or of the first shift.

* * * * *